United States Patent [19]

Oeffinger et al.

[11] 4,358,339
[45] Nov. 9, 1982

[54] METHOD OF FABRICATION OF BUBBLE DOMAIN DEVICE STRUCTURES

[75] Inventors: Thomas R. Oeffinger, Huntington Beach; Robert F. Bailey, Rossmoor; Tsutomu Kobayashi, Placentia; John P. Reekstin, Orange, all of Calif.

[73] Assignee: Rockwell International Corporation, El Segundo, Calif.

[21] Appl. No.: 157,143

[22] Filed: Jun. 6, 1980

Related U.S. Application Data

[63] Continuation-in-part of Ser. No. 928,487, Jul. 27, 1978, abandoned.

[51] Int. Cl.³ ............. B44C 1/22; C03C 15/00; C03C 25/06; C23F 1/02
[52] U.S. Cl. ............. 156/643; 156/656; 156/659.1; 357/27; 365/32; 427/131
[58] Field of Search ........ 365/1, 2, 8, 19, 29, 365/32; 204/192 E, 192 EC; 357/27; 156/643, 652, 653, 656, 657, 659.1; 427/128–132; 430/311–319

[56] References Cited

U.S. PATENT DOCUMENTS

| | | | |
|---|---|---|---|
| 4,146,440 | 3/1979 | Thompson | 357/71 X |
| 4,172,758 | 10/1979 | Bailey et al. | 156/643 |
| 4,178,635 | 12/1979 | Rose | 365/19 |
| 4,187,553 | 2/1980 | Ahn et al. | 427/131 X |

OTHER PUBLICATIONS

IBM Technical Disclosure Bulletin, vol. 20, No. 1, Jun. 1977, Single-Level Metallurgy Process for Fabrication of Bubble Overlays by L. T. Romankiw, pp. 394–395.

*Primary Examiner*—William A. Powell
*Attorney, Agent, or Firm*—H. Fredrick Hamann; Daniel R. McGlynn

[57] ABSTRACT

A method of fabricating a microelectronic circuit device on a substrate by forming a layer of electrically and thermally conductive material (13) on a surface of a substrate (10). Channels are then etched in the layer of conductive material (13) to form patterns of the conductive material which are delineated from the remainder of the layer of conductive material.

The channels are filled with an electrically insulating material (21, 22, 23) so as to form a substantially planar surface layer on the substrate. Finally, a microelectronic circuit device (e.g., 25) is formed on the substantially planar surface.

29 Claims, 5 Drawing Figures

METHOD OF FABRICATION OF BUBBLE DOMAIN DEVICE STRUCTURES

This is a Continuation-in-Part of copending U.S. application, Ser. No. 928,487, entitled THERMALLY UNIFORM REFLECTIVE PLANAR PROCESS AND APPARATUS, filed July 27, 1978, now abandoned.

FIELD OF THE INVENTION

The invention relates to a method of fabrication for microelectronic device structures, and in particular to a method of fabrication magnetic bubble domain devices.

BACKGROUND OF THE INVENTION

Many types of microelectronic devices such as semiconductor devices and magnetic bubble domain devices are well known in the art. As smaller and smaller device structures are produced using fine line lithography, greater demands are made upon the fabrication techniques. This is particularly a problem with magnetic bubble domain devices in which thermal gradients may be produced at various localized areas where there is bubble switching replication or the like. The thermal gradients result in severe operating margin degradation because of thermal non-uniformities existing over the surface of large area magnetic bubble domain chips. Greater demands are placed upon the fabrication process. Particularly in the case of non-planar devices, in which various layers of materials are placed sequentially upon the original substrate. Such layers generally follow the contours of the preceding layers. Thus, in a multi-level device certain regions such as cross-over areas, corners, and the like are subject to various fabrication problems such as cracks, discontinuities, or other defects.

Moreover, device characterization by optical/visual techniques is difficult because of the lack of bubble domain contrast as bubble domain diameters decrease and as the layer of bubble domain material becomes thinner.

Non-planar bubble domain device operating margins suffer a degradation due to the fact that all the Permalloy elements cannot be located at the optimum spacing distance from the garnet. Further, higher drive field power is required to operate the non-planar device compared to planar devices. Therefore, bubble device component design compromises must be made to account for the non-planar nature of the topographical features.

All of the problems noted above affect yield and performance characteristics. However, no suitable solution has previously been proposed which can solve one or more of these shortcomings.

SUMMARY OF THE INVENTION

Briefly, and in general terms, there is described a method for producing a microelectronic device which utilizes a suitable substrate which is covered by a suitable isolation layer. A layer of non-ferromagnetic, thermally and electrically conductive, material is deposited on the isolation layer. Suitable patterns are established in the conductive layer wherein electrical conductor elements and paths are delineated from the remainder of the conductive layer by means of a suitable isolation material. Appropriate areas are provided on the conductive layer (with the delineated conductor patterns therein) such that a suitable microelectronic device is produced.

More particularly, the invention provides a method of manufacturing a microelectronic device comprising the steps of depositing a barrier layer of a suitable dilectric on the substrate; subsequentially depositing a layer of electrically conductive material thereover; subsequently depositing a spacer layer of dielectric material over set conductor layer;

and subsequently depositing a layer of a magnetically operative material over said spacer layer.

DESCRIPTION OF A PREFERRED EMBODIMENT

Figure 1:
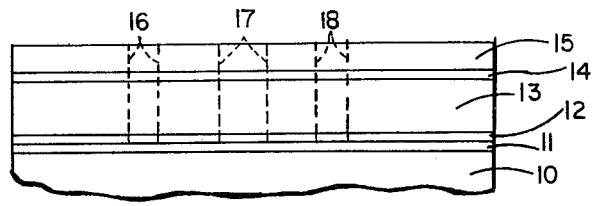
FIGS. 1, 2 and 3 are cross-sectional views of the composite of the instant invention during the processing thereof, according to the planar process according to the present invention.

Referring now to FIG. 1, there is shown a cross-secctional view of a composite which is formed during the process involved in the instant invention.

A suitable substrate 10 is provided. Substrate 10 may be of any suitable material such as a semiconductor device and the like. For purposes of this explanation, substrate 10 may be considered to be a magnetic bubble domain material such as a suitable garnet which is well known in the art. The garnet substrate may be of any suitable thickness such as $\sim$ 20 mils. Deposited on a surface of substrate 10 is layer 11 of a suitable dilectric isolation material. Isolation layer 11 may be formed of Schott glass, an optical glass made by the Schott Optical Glass Inc., Duryea, Pa. 18612 which has typical thickness on the order of 300 to 5000 Angstroms. The Schott glass layer may be deposited using E-beam evaporation at a substrate temperature of approximately 200° C. Of course, any suitable technique for forming layer 11 on the surface of substrate 10 is contemplated.

A thin layer 12 of nickel chrome (NiCr) on the order of 25 to 500 Angstroms is placed on the upper surface of layer 11. This thin, flash layer is used primarily to establish and enhance adhesion of subsequent layers to layer 11. Any suitable material can be utilized. Of course, in some cases, layer 12 may not be needed if the subsequent material has a characteristically good adhesion to layer 11.

Layer 13 is then provided on layer 12 in a suitable fashion such as evaporation, electrodeposition or the like. Layer 13 typically has a thickness of 1000 to 6000 Angstroms. Layer 13 is formed of any suitable material which is conductive, both thermally and electrically. The type of material is a function of the characteristics required by the microelectronic device. Typically, layer 13 may be copper-doped-aluminum, or indium-doped-silver as disclosed in co-pending application entitled Metal Alloys for Magnetic Bubble Domain Devices, by R. F. Bailey, now U.S. Pat. No. 4,172,758 and assigned to the common assignee. Of course any other suitable or desirable conductive material can be utilized.

A further adhesion layer 14 which is substantially similar to adhesion layer 12 is provided on the surface of conductor layer 13. Flash layer 14 may be on the order of 25 to 500 Angstroms. Layer 14, in addition to performing the function of adhesion to the subsequent deposited layers, also performs the function providing an electrochemical or electroless chemical plating surface for increasing the thickness of the conductor bond pads.

Masking layer 15 is then provided on the upper surface of adhesion layer 14. Masking layer 15 may be of any suitable type of material such as photoresist type AZ1350-J manufactured by Shipley. The thickness of masking layer 15 is determined by the processes to be used but in the process defined herein and with the dimensions and materials noted, layer 15 may have a thickness of 0.5 to 2.0 microns. Masking layer 15 is then treated in the appropriate manner for establishing a mask layer. For example, layer 15 may be exposed and developed by ultraviolet light and other known techniques. However, masking layer 15 is treated in a manner which permits operation in any etching techniques. For example, chemical etching of the masked surface has been used in this planar process. However, ion milling or other dry etching techniques can be utilized, also.

When masking layer 15 has been properly treated, and the appropriate pattern is defined, etching or ion milling processes are undertaken and the pattern which has been delineated by mask 15 is transcribed wherein the material between dashed lines 16, 17 and 18 is removed completely through to isolation layer 11. By using ion milling techniques and with the appropriate thicknesses of the materials, substantially vertical walls (defined by lines 16, 17 and 18) are produced in the composite. As noted, chemical etching has also proved satisfactory.

Figure 2:
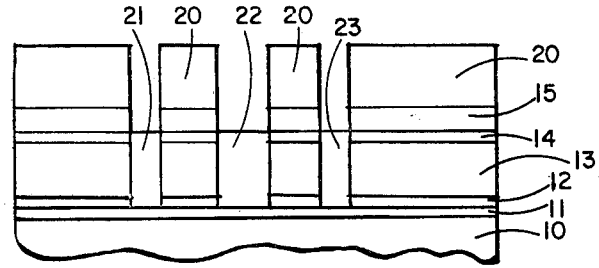

Referring now to FIG. 2, the fully etched composite described relative to FIG. 1 is provided. A second layer of Schott glass or the like is provided over the surface of the entire deposit shown in FIG. 2. The thickness of the second layer 20 of Schott glass is on the order of 1000 to 6000 Angstroms. It is noted that the thickness of layer 20 is substantially the same as the sum of the thickness of conductive layer 13 as well as adhesion layers 12 and 14. Thus, a relative uniform thickness layer 20 is provided on the surface of masking layer 15 where it exits. In addition, a relatively uniform thickness layer of glass is formed at portions 21, 22 and 23. Thus, isolation layers 21, 22 and 23 are now disposed in the channels etched in the composite as suggested relative to FIG. 1. The second Schott glass layer 20 may be provided by using a standard E-beam deposition method for example.

Figure 3:
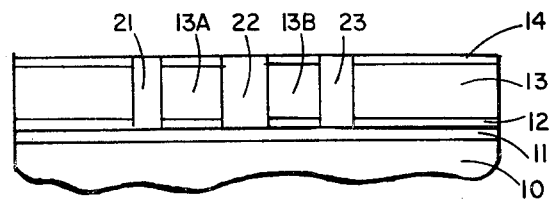

Referring now to FIG. 3, there is shown the composite from FIG. 2, after the lift-off process relative to masking layer 15 is produced. That is, the deposit shown in FIG. 2 is soaked in a suitable solution such as warm acetone for a short time (e.g. 10 to 15 minutes). This soak is usually sufficient to swell and dissolve masking layer 15 such that it and any materials deposited thereon are removed. Consequently, a planar surface is provided by conductive layer 13 (coated with layer 14) and isolation layer portions 21, 22 and 23. In point of fact, as will be shown later, conductive layer portions 13A and 13B are isolated from the remainder of conductive layer 13. In fact, layer portions 13A and 13B can be isolated from each other by isolation portion 22. However, the separation of the various portions of layer 13 is a function of the design which is desired or required in the conductors. Thereafter, any desirable cleaning steps can be undertaken such as ultrasonically removing the remainder of the masking layer 15 which may adhere to the composite. Removal of the acetone or similar materials can be effected also.

Figure 4:
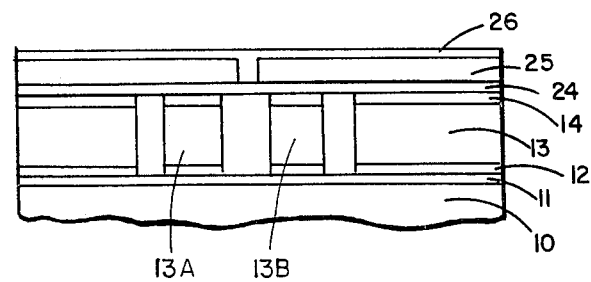
FIG. 4 is a cross-sectional view of a composite formed in accordance with the planar process according to the present invention and representing a magnetic bubble domain device.

Once the cleansing processes have been completed, the final layers and/or steps can be completed as a function of the device in question. Referring to FIG. 4, a composite representative of a magnetic bubble domain device is shown. In the particular embodiment of FIG. 4, a thin layer 24 of silicon dioxide ($SiO_2$) or other suitable dielectric material is deposited over the surface of the composite. Layer 24 is typically on the order of 300 to 3000 Angstroms. The dielectric layer can be provided by means of sputter deposition or other suitable process. Thereafter, layer 25, which is preferably a permalloy, is deposited on layer 24. Layer 25 can be on the order of 2500-5000 Angstroms and can also be sputtered or otherwise deposited. Suitable patterns can be produced in layer 25 by applying, exposing developing, baking and otherwise utilizing a photoresist mask to provide a pattern which is produced in layer 25 by ion milling or chemical etching. The photoresist is then stripped and a suitable passivation layer 26 of dielectric can be deposited. The passivation layer can be on the order of 1000 to 30,000 Angstroms thick and can be provided by any suitable process.

Thus, there has been shown and described a method for producing a composite structure for planar devices. With the planar approach, various switching devices and the like can be fabricated. In magnetic bubble domain devices, for example, a lower drive field is permitted and a wider margin is produced. In addition, switch resistance on magnetic bubble domain devices can be substantially reduced for a given design. Also increased design flexibility is permitted in fabricating circuits and systems.

In addition, the large area of thermally conductive layer 13 is able to distribute temperature gradients and operate as a heat sink. This facility reduces thermal gradients from one area to another in the microelectronics structure and is especially desirable and useful in magnetic bubble domain circuits.

Another advantage of this composite is in the testing thereof. That is, optical/visual testing has been performed in the past wherein the contrast between the bubble domain and the surrounding layer of magnetic bubble domain material is observed. Of course, as bubbles become smaller the contrast is more difficult to observe. Furthermore, as the bubble layer (i.e. garnet substrate 10) becomes thinner in order to establish smaller diameter bubbles, contrast is also reduced. In the past, optical rotation and the like have been devised by projecting the energy beam (e.g. light) through the substrate, reflecting same from the propagation layer or the like in order to obtain a multiplying factor on the contrast which is a function of reflectance of the structure. In the composite shown and described herein, conductive layer 13 also serves as a mirror surface which reflects any light projected from beneath the substrate. This highly reflective layer operates to vastly improve the reflection of the device and thus to enhance the contrast and the visual testing capability.

The advantage of the planar device in various processing techniques is believed clear. This is, the crossover and step fabrication problems are eliminated. In addition, difficulties in fabrication uniformity are reduced as well. Also, surface abrasion is minimized because of the lack of steps to be abraded.

Figure 5:
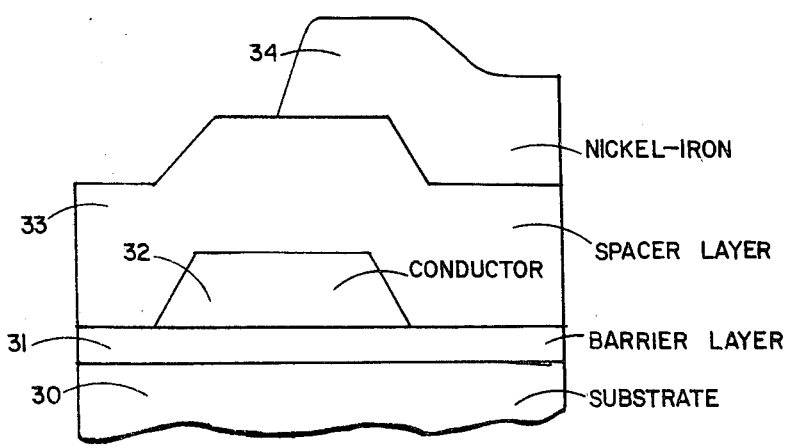
FIG. 5 is a cross-sectional view of a composite formed according to the present invention using a non-planar process.

Referring now to FIG. 5, there is shown a cross-sectional view of a microelectronic device which is formed using a non-planar process according to the present invention.

A suitable substrate 30 such as a semiconductor material or a magnetic bubble domain material or layer having a thin layer of material capable of supporting magnetic bubble domains is provided. The entire substrate together with the magnetic bubble domain layer may be of any suitable thickness, such as around 20 mils.

Deposited over the surface of the layer of the substrate 30 is a planar barrier layer 31 of a suitable dielectric isolation material. The barrier layer 31 is preferably formed of a suitable Schott glass which has a thickness of from 1,000 to 4,000 Angstroms. Schott glass is a glass produced by Schott Optical Glass Inc., Duryea, Pa. This Schott glass layer is preferably deposited by means of sputtering at a temperature of approximately 100°–300° C. Other types of deposition, such as evaporation, flame-spraying, and ion-beam deposition are also possible.

Over the barrier layer 31 is formed a layer 32 of a conductive material. Such a layer may consist of discrete spaced-apart conductor lines having a thickness of approximately 4,000 Angstroms. The conductive layer 32 is formed of any suitable material which is conductive, both thermally and electrically. The particular type of material chosen is a function of the characteristics required by the microelectronic device. In a magnetic bubble domain device, the conductor may preferably be a copper doped aluminum, although any other suitable conductive material may be utilized as well.

The conductor layer 32 is preferably deposited by the same technique as the deposition of the barrier layer 31, that is, sputtering or evaporation. The sequential deposition of the barrier 31 and the conductor layer 32 is advantageous because the two operations may be performed in the same vacuum cycle.

Following the deposition of the conductive layer 32, it is patterned by means of a mask and etched according to techniques known in the art to form strips or other desired patterns.

Following the patterning of the conductor layer 32, a spacer layer 33 of a paramagnetic material is deposited over the conductor layer and the barrier layer. The thickness of the spacer layer 33, typically composed of a suitable Schott glass, is of the order of 2,000 to 6,000 Angstroms. The spacer layer 33 uniformly covers the surface of the microelectronic device, and may be deposited by either sputtering or evaporation.

Over the spacer layer 33 is provided a pattern of magnetically operative elements 34, formed from a layer of nickel-iron or Permalloy, which are used to form the guide structure in a field access magnetic bubble domain device. The discrete patterns or elements 34 are used to guide propagation of the magnetic bubbles in the layer of the substrate, as is well known in the art.

The layer 34 of nickel-iron is preferably around 4,000 Angstroms in thickness and may be applied by means of sputtering or evaporation, preferably in the same manner as the deposition of the spacer layer. Again, the deposition of both the spacer layer and the magnetically operative nickel-iron layer in the same vacuum cycle is advantageous to save processing time.

Following the deposition of the nickel-iron layer 34, thereon by applying a photoresist layer thereover, exposing it, developing it, baking it or otherwise utilizing photoresist technology followed by ion milling or chemical etching to produce a desired pattern. After the photoresist is stripped, a suitable passivation layer (not shown) of dielectric material may then be deposited over the entire structure. The deposition of such a passivation layer may be performed by any suitable process.

The composite non-planar structure of a magnetic bubble domain device according to the present invention permits the fabrication of magnetic bubble domain devices in which lower drive fields are required and wider operating margins are permitted.

There has been shown and described processes for producing a bubble domain device structure which has many advantages in microelectronic circuitry.

Having thus described a preferred embodiment of the invention, what is claimed is:

1. A method of fabricating a microelectronic circuit device from a garnet substrate capable of maintaining magnetic bubble domains in the presence of a bias magnetic field comprising the steps of:
   forming a barrier layer composed of a dielectric glass on said substrate;
   forming a layer of electrically and thermally conductive material over said barrier layer and substantially the entire substrate;
   etching narrow grooves into said layer of electrically and thermally conductive material to said barrier layer to form a patterned arrangement;
   depositing a spacer layer of electrically nonconductive material of substantially uniform thickness over said layer of electrically and thermally conductive material; and
   depositing a layer of a magnetically operative material over said spacer layer.

2. A method of defined in claim 1, wherein said barrier layer comprises an optical glass.

3. A method as defined in claim 1, wherein said layer of conductive material comprises an aluminum-copper alloy.

4. A method as defined in claim 1 wherein said spacer layer comprises an optical glass.

5. A method as defined in claim 1, wherein said magnetically operative layer comprises nickel iron.

6. A method as defined in claim 1, wherein said step of depositing a barrier layer comprises sputtering.

7. A method as defined in claim 1, wherein said step of depositing a barrier layer comprises evaporation.

8. A method as defined in claim 1 wherein said layer of electrically and thermally conductive material is deposited at a thickness between 1000 and 6000 Angstroms.

9. A method as defined in claim 1 wherein said etching step comprises ion milling said layer of electrically and thermally conductive material.

10. A method of fabricating a microelectronic circuit device from a garnet substrate capable of maintaining magnetic bubble domains in the presence of a bias magnetic field comprising the steps of:
    forming an isolation layer composed of a dielectric glass on said substrate;
    forming a layer of electrically and thermally conductive material over said isolation layer and substantially the entire substrate;
    etching narrow grooves into said layer of electrically and thermally conductive material to said isolation layer to form a patterned arrangement;

depositing a layer of electrically nonconductive material in said grooves such that the top surface of said layer of nonconductive material is coplanar with the top surface of said layer of conductive material; and forming microelectronic devices comprising magnetic operative elements on the surface of said layer of conductive material and said layer of nonconductive material.

11. The method recited in claim 10 including the step of forming a passivation layer on said microelectronic circuit device.

12. A method as defined in claim 10 wherein said dielectric glass comprises an optical glass.

13. A method as defined in claim 10 wherein said layer of electrically and thermally conductive material comprises an aluminum copper alloy.

14. A method as defined in claim 10 wherein said layer of electrically and thermally conductive material is deposited at a thickness between 1000 and 6000 Angstroms.

15. A method as defined in claim 10 wherein said etching step comprises ion milling said layer of electrically and thermally conductive material.

16. A method as defined in claim 10, wherein said step of depositing a layer of electrically nonconductive material comprises depositing an optical glass.

17. A method of fabricating a microelectronic circuit device from a garnet substrate capable of maintaining magnetic bubble domains in the presence of bias magnetic field comprising steps of:

forming an isolation layer composed of a dielectric glass on said substrate;

forming a layer of electrically and thermally conductive material over said isolation layer and substantially the entire substrate;

etching said layer of electrically and thermally conductive material to form first and second spaced apart regions, said first region extending over substantially the entire substrate and functioning as a heat sink; and forming microelectronic devices on said layer of conductive material.

18. A method as defined in claim 17 wherein said microelectronic devices comprise permalloy elements deposited over said layer of conductive material.

19. A method as defined in claim 17 wherein said dielectric glass comprises an optical glass.

20. A method as defined in claim 17 wherein said layer of electrically and thermally conductive material is deposited at a thickness between 1000 and 6000 Angstroms.

21. A method as defined in claim 17 wherein said step of etching said layer of electrically and thermally conductive material comprises etching completely through said layer to said isolation layer.

22. A method as defined in claim 17 further comprising the step of depositing a layer of electrically nonconductive material in said grooves such that the top surface of said layer of nonconductive material is coplanar with the top surface of said layer of electrically and thermally conductive material.

23. The method as defined in claim 22 wherein said layer of electrically nonconductive material is an optical glass.

24. A method of fabricating a microelectronic circuit device from a garnet substrate capable of maintaining magnetic bubble domains in the presence of bias magnetic field comprising steps of:

forming a barrier layer composed of a dielectric glass on said substrate;

forming a layer of electrically and thermally conductive material over said barrier layer and substantially the entire substrate;

etching said layer of electrically and thermally conductive material to form first and second spaced apart regions, said first region extending over substantially the entire substrate and functioning as a heat sink;

depositing a spacer layer of electrically nonconductive material of substantially uniform thickness over said layer of electrically and thermally conductive material; and depositing a layer of a magnetically operative material over said spacer layer.

25. A method as defined in claim 24 wherein said microelectronic devices comprise permalloy elements deposited over said layer of conductive material.

26. A method as defined in claim 24 wherein said dielectric glass comprises an optical glass.

27. A method as defined in claim 24 wherein said layer of electrically and thermally conductive material is deposited at a thickness between 1000 and 6000 Angstroms.

28. A method as defined in claim 24 wherein said step of etching said layer of electrically and thermally conductive material comprises etching completely through said layer to said barrier layer.

29. The method as defined in claim 24 wherein said layer of electrically nonconductive material is an optical glass.

* * * * *